(12) United States Patent
Hosokawa et al.

(10) Patent No.: US 8,421,727 B2
(45) Date of Patent: Apr. 16, 2013

(54) TRANSMITTER CIRCUIT, TRANSMISSION CIRCUIT AND DRIVER UNIT

(75) Inventors: Akio Hosokawa, Kanagawa (JP); Kouichi Nishimura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/436,640

(22) Filed: Mar. 30, 2012

(65) Prior Publication Data

US 2012/0188214 A1 Jul. 26, 2012

Related U.S. Application Data

(62) Division of application No. 10/853,654, filed on May 26, 2004.

(30) Foreign Application Priority Data

May 29, 2003 (JP) .................................. 2003-152745

(51) Int. Cl.
*G09G 3/36* (2006.01)
*H03K 19/094* (2006.01)
*H03K 3/00* (2006.01)
*H03B 1/00* (2006.01)

(52) U.S. Cl.
USPC .............................. 345/87; 326/83; 327/108

(58) Field of Classification Search ............ 345/87–104, 345/204; 326/80–88; 327/108–112; 330/252–261
See application file for complete search history.

(56) References Cited

U.S. PATENT DOCUMENTS 5,444,740 A 8/1995 Mizukami et al.
5,495,197 A * 2/1996 Hayashi et al. ............... 327/276
(Continued)

FOREIGN PATENT DOCUMENTS

JP 1-161943 6/1989
JP 2-111126 A 4/1990
(Continued)

OTHER PUBLICATIONS

Gary Hendrickson, "Low Voltage Differential Signaling gives A/D converters higher sample rates", Oct. 2, 2002; Planet Analog; http://www.planetanalog.com/features/signal/OEG20021002S0048.

(Continued)

*Primary Examiner* — Bipin Shalwala
*Assistant Examiner* — Steven Holton
(74) *Attorney, Agent, or Firm* — McGinn IP Law Group, PLLC

(57) ABSTRACT

A transmitter circuit includes a driver circuit including a non-inverting output terminal and an inverting output terminal for outputting a signal current, which has a loop direction that changes based upon an input signal, to the non-inverting output terminal and the inverting output terminal and an output-waveform control circuit for detecting a waveform edge of the input signal and responding by increasing the signal current temporarily. The output-waveform control circuit includes a first inverter circuit receiving a non-inverted input signal, a first capacitor including one end connected to an output terminal of the first inverter circuit and another end connected to the inverting output terminal, a second inverter circuit receiving an inverted input signal, and a second capacitor including one end connected to an output terminal of the second inverter circuit and another end connected to the non-inverting output terminal.

8 Claims, 11 Drawing Sheets

U.S. PATENT DOCUMENTS

| | | | |
|---|---|---|---|
| 5,576,634 A * | 11/1996 | Kamiya | 326/26 |
| 5,931,939 A * | 8/1999 | Jacobs | 712/24 |
| 5,959,472 A | 9/1999 | Nagamatsu et al. | |
| 6,166,971 A | 12/2000 | Tamura et al. | |
| 6,281,715 B1 | 8/2001 | DeClue et al. | |
| 6,292,014 B1 | 9/2001 | Hedberg | |
| 6,690,744 B2 | 2/2004 | Hedberg | |
| 7,030,665 B2 | 4/2006 | Takeuchi | |
| 7,149,271 B2 | 12/2006 | Yamada et al. | |
| 7,164,299 B2 | 1/2007 | Nedachi | |

FOREIGN PATENT DOCUMENTS

| | | |
|---|---|---|
| JP | 6-104936 | 4/1994 |
| JP | 9-214314 | 8/1997 |
| JP | 11-345054 A | 12/1999 |
| JP | 2000-31810 | 1/2000 |
| JP | 2000-68816 | 3/2000 |
| JP | 2000-196681 | 7/2000 |
| JP | 2002-368600 | 12/2002 |
| JP | 2003-101595 | 4/2003 |
| JP | 2004-15621 A | 1/2004 |
| JP | 2004-228613 A | 8/2004 |
| JP | 2004-312614 A | 11/2004 |
| WO | WO 03/084161 A1 | 9/2003 |

OTHER PUBLICATIONS

Japanese Office Action dated May 29, 2008, with partial English translation.

Japanese Office Action dated Oct. 2, 2007, with partial English translation.

United States Office Action dated Dec. 22, 2011 in U.S. Appl. No. 10/853,654.

* cited by examiner

TRANSMITTER CIRCUIT, TRANSMISSION CIRCUIT AND DRIVER UNIT

The present application is a Divisional application of U.S. patent application Ser. No. 10/853,654 filed on May 26, 2004, and claims priority from Japanese Patent Application No. 2003-152745, filed on May 29, 2003, the entire contents of which is incorporated herein by reference.

FIELD OF THE INVENTION

This invention relates to a transmitter circuit, a transmission circuit and a driver unit. More particularly, the invention relates to a transmitter circuit, a transmission circuit and a driver unit applicable to a liquid crystal display device, an organic electroluminescence display device and a plasma display device.

BACKGROUND OF THE INVENTION

Conventionally, in a matrix-type liquid crystal display device, an organic electroluminescence (EL) display device and a plasma display device, a timing controller LSI chip, which successively generates and outputs one horizontal line of a grayscale data signal and scanning signal from one frame of image signals, and a source driver LSI chip, which serves as a driver unit that receive the grayscale data signal and drive respective ones of data lines of a display panel, are mounted on a printed circuit board. Transmission of signals between the timing controller LSI chip and the source driver LSI chip, as well as transmission of signals between the source driver LSI chips that are cascade-connected, is achieved by transmission lines consisting of printed conductor. An LVDS (Low Voltage Differential Signaling) interface, for example, is a high-speed interface used as the transmission circuit.

As shown in FIG. 11, the conventional transmitter circuit of an LVDS interface includes a constant-current source 6 having one end connected to a high-potential power supply VDD; a constant-current source 7 having one end connected to a low-potential power supply VSS; an N-channel MOS transistor N1 and an N-channel MOS transistor N2 serving as switching means connected serially between the other end of the constant-current source 6 and the other end of the constant-current source 7; an N-channel MOS transistor N3 and an N-channel MOS transistor N4 serving as switching means connected serially between the other end of the constant-current source 6 and the other end of the constant-current source 7; a non-inverting output terminal 2 connected to the node of the N-channel MOS transistor N1 and N-channel MOS transistor N2; and an inverting output terminal 3 connected to the node of the N-channel MOS transistor N3 and N-channel MOS transistor N4. A terminating resistor of a receiver circuit is connected between the non-inverting output terminal 2 and inverting output terminal 3 via a pair of transmission lines, and a voltage comparator of the receiver circuit recognizes signal logic by discriminating the voltage across the terminating resistor. A CMOS-level non-inverted input data signal supplied to an input terminal 1 is applied to the gate terminal of the N-channel MOS transistor N1 and to the gate terminal of the N-channel MOS transistor N4. An inverting input data signal, which is a result of the non-inverted input data signal being inverted by the CMOS-type inverter circuit 5, is applied to the gate terminal of the N-channel MOS transistor N2 and to the gate terminal of the N-channel MOS transistor N3. When the non-inverted input data signal is at the VDD level serving as logic H, the N-channel MOS transistors N1 and N4 turn on, the N-channel MOS transistors N2 and N3 turn off, loop signal current flows from the constant-current source 6 to the constant-current source 7 via the N-channel MOS transistor N1, non-inverting output terminal 2, transmission line, terminating resistor, transmission line, inverting output terminal 3 and N-channel MOS transistor N4, and the receiver circuit recognizes the logic H level. When the non-inverted input data signal is at the VSS level serving as logic L, the N-channel MOS transistors N1 and N4 turn off, the N-channel MOS transistors N2 and N3 turn on, loop signal current in the opposite direction flows from the constant-current source 6 to the constant-current source 7 via the N-channel MOS transistor N3, non-inverting output terminal 3, transmission line, terminating resistor, transmission line, non-inverting output terminal 2 and N-channel MOS transistor N2, and the receiver circuit recognizes the logic L level.

Patent Document 1
Japanese Patent Kokai Publication No. JP-P2000-31810A (FIG. 13)

SUMMARY OF THE DISCLOSURE

For the purpose of reducing the size, weight and cost of display devices, progress has recently been made in COG (Chip On Glass) techniques for mounting a source driver LSI chip on a glass substrate such as a matrix display panel. In such an arrangement, transmission of signals between a timing controller LSI chip and the source driver LSI chip, as well as transmission of signals between the cascade-connected source driver LSI chips, is by transmission lines, which consist of aluminum or copper conductor, formed on the glass substrate.

However, whereas the resistance component of a transmission line consisting of copper conductor on a printed circuit board is several tens of milliohms, the resistance component of a transmission line consisting of aluminum or copper conductor formed on a glass substrate is several hundred ohms because both the conductor thickness and conductor width are small owing to the fabrication process for the display panel. The output capacitance of the transmitter circuit and the input capacitance of the receiver circuit is several picofarads. Consequently, even if signal transmission is performed in a high-frequency region that exceeds 100 MHz with the higher resolutions and larger screen areas of display panels, the signal waveform at the input end of the receiver circuit becomes significantly blunted owing to the RC time constant and a problem that arises is that good signal transmission cannot be achieved.

SUMMARY OF THE INVENTION

Accordingly, an object of the present invention is to provide a transmitter circuit, a transmission circuit and a driver unit in which high-speed signal transmission can be performed by reducing blunting of the signal waveform at the input end of the receiver circuit even if the transmission line has a high resistance component as in the manner of aluminum or copper conductor on a glass substrate.

The above and other objects are attained by a transmitter circuit in accordance with one aspect of the present invention, comprising a driver circuit, which has a non-inverting output terminal and an inverting output terminal, for outputting a signal current, whose loop direction changes based upon an input signal, to the non-inverting output terminal and inverting output terminal; and an output-waveform control circuit for detecting a waveform edge of the input signal and increasing the signal current temporarily.

Further, in the transmitter circuit in accordance with the present invention, the output-waveform control circuit preferably includes an edge detecting circuit for outputting a detection signal when the edge is detected; switch means turned on by the detection signal; and a current source for supplying a current, which is added to the signal current, when the switch means has been turned on.

In the transmitter circuit in accordance with another aspect of the present invention, the output-waveform control circuit preferably includes a first inverter to which a non-inverted input signal is applied; a first capacitor having one end connected to an output terminal of the first inverter circuit and another end connected to the inverting output terminal; a second inverter circuit to which an inverted input signal is applied; and a second capacitor having one end connected to an output terminal of the second inverter circuit and another end connected to the non-inverting output terminal.

In the transmitter circuit in accordance with the present invention, the driver circuit preferably includes a first transistor, which has a non-inverting output terminal and an inverting output terminal, to which a non-inverted input signal is applied, for switching in response and passing a current from a high-potential power supply to the non-inverting output terminal; a third transistor, to which the inverted input signal is applied, for switching in response and passing a current from the high-potential power supply to the inverting output terminal; a fourth transistor, to which the non-inverted input signal is applied, for switching in response and passing a current from the inverting output terminal to a low-potential power supply; and a second transistor, to which the inverted input signal is applied, for switching in response and passing a current from the non-inverting output terminal to the low-potential power supply.

Further, the above and other objects are attained by a transmitter circuit in accordance with another aspect of the present invention, comprising a driver circuit, which has a non-inverting output terminal and an inverting output terminal, for outputting a differential voltage, whose polarity changes based upon an input signal, to the non-inverting output terminal and inverting output terminal; and an output-waveform control circuit for detecting a waveform edge of the input signal and increasing the differential voltage temporarily.

Further, the output-waveform control circuit in the transmitter circuit according to the present invention preferably includes an edge detecting circuit for outputting a first detection signal when a rising edge of the waveform is detected and a second detection signal when a falling edge of the waveform is detected; switch means for pulling up the non-inverting output terminal in response to the first detection signal; switch means for pulling down the inverting output terminal in response to the first detection signal; switch means for pulling down the non-inverting output terminal in response to the second detection signal; and switch means for pulling up the inverting output terminal in response to the second detection signal.

Further, the driver circuit according to the present invention includes a potential dividing circuit for generating high- and low-level potential-divided voltages; switch means for selecting the potential-divided voltage based upon a non-inverted input signal and outputting the voltage to the non-inverting output terminal; and switch means for selecting the potential-divided voltage based upon the non-inverted input signal and outputting the voltage to the inverting output terminal.

Further, according to the present invention, the foregoing object is attained by providing a transmission circuit comprising the above-described transmitter circuit; a transmission line having one end connected to the non-inverting output terminal and inverting output terminal of the transmitter circuit; and a receiver circuit connected to the other end of the transmission line.

Further, the above and other objects are attained by a driver unit in accordance with another aspect of the present invention, comprising a shift register circuit to which is input grayscale data for driving data lines of a matrix display panel; and the above-described transmitter circuit connected to a serial output end of the shift register circuit.

The drive unit according to the present invention preferably comprises the transmission line described above.

Further, the transmission line of the driver unit according to the present invention comprises a conductor on a glass substrate of the matrix display panel.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will now be described in detail with reference to the drawings.

Figure 1:
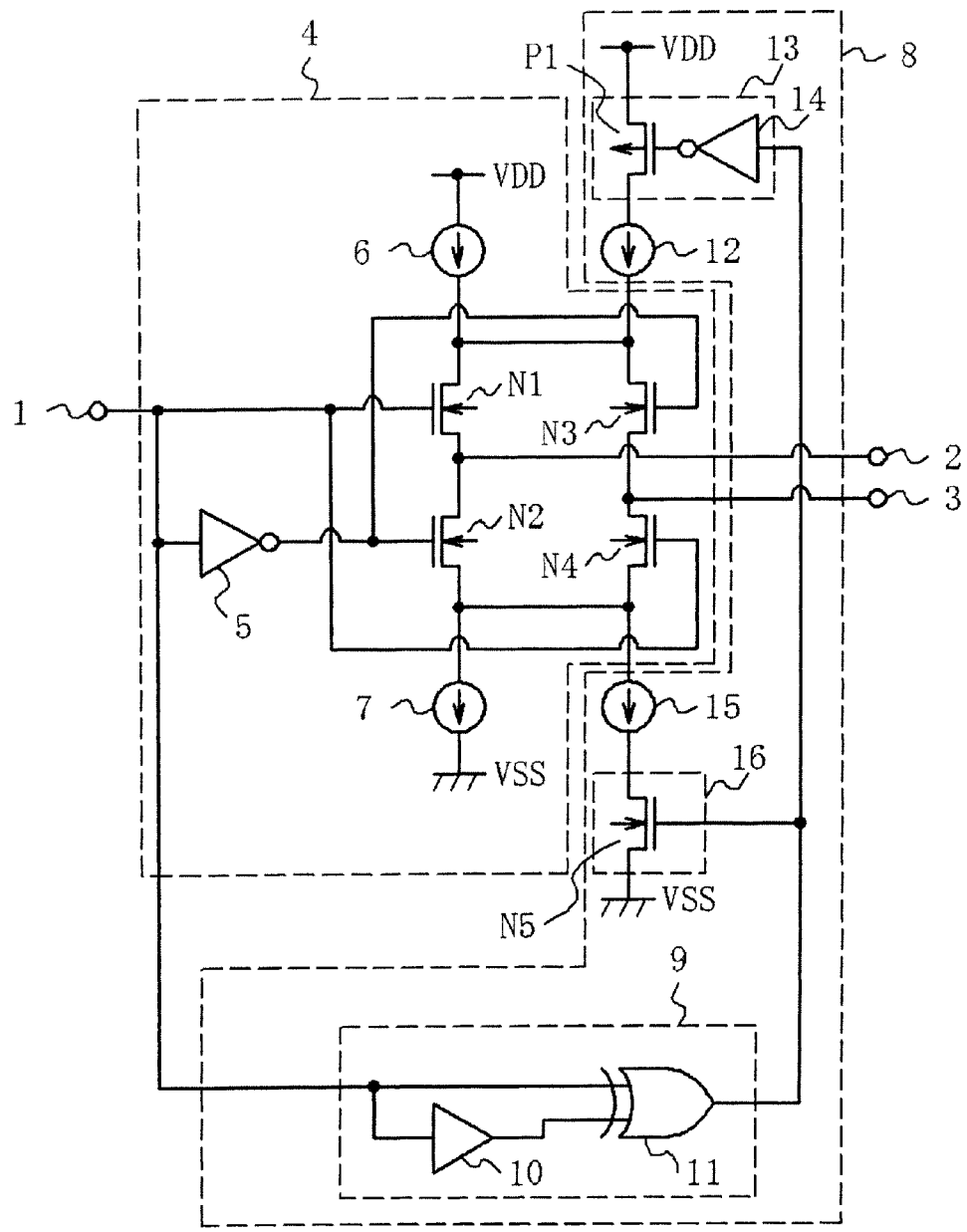
FIG. 1 is a circuit diagram illustrating a transmitter circuit according to a first embodiment of the present invention.

FIG. 1 is a diagram illustrating a configuration of a transmitter circuit according to a first embodiment of the present invention. As shown in FIG. 1, the transmitter circuit includes an input terminal 1, a non-inverting output terminal 2, an inverting output terminal 3, a driver circuit 4 and an output-waveform control circuit 8.

The driver circuit 4 includes a CMOS-type inverter circuit 5, a constant-current source 6 for signal current source, a constant-current source 7 for signal current sink, and N-channel MOS transistors N1, N2, N3 and N4. One end of the constant-current source 6 is connected to a high-potential power supply VDD and the other end thereof is connected to the drain terminal of the N-channel MOS transistor N1 and to the drain terminal of the N-channel MOS transistor N3. One end of the constant-current source 7 is connected to a low-potential power supply VSS and the other end thereof is connected to the source terminal of the N-channel MOS transistor N2 and to the source terminal of N-channel MOS transistor N4. The source terminal of the N-channel MOS transistor N1 is connected to the drain terminal of the N-channel MOS transistor N2 and the source terminal of the N-channel MOS transistor N3 is connected to the drain terminal of the N-channel MOS transistor N4. The input terminal 1 is connected to the gate terminal of the N-channel MOS transistor N1, the gate terminal of the N-channel MOS transistor N4 and the input terminal of the inverter circuit 5, and the output terminal of the inverter circuit 5 is connected to the gate terminal of the N-channel MOS transistor N2 and to the gate terminal of the N-channel MOS transistor N3. The non-inverting output terminal 2 is connected to the source terminal of the N-channel MOS transistor N1 and the inverting output terminal is connected to the source terminal of the N-channel MOS transistor N3.

The output-waveform control circuit 8 includes an edge detecting circuit 9, a constant-current source 12 for a signal current source, switch means 13, a constant-current source 15 for signal current sink and switch means 16.

The edge detecting circuit 9 includes a CMOS-type non-inverting buffer circuit 10 and a CMOS-type exclusive-OR gate 11. The input terminal of the non-inverting buffer circuit 10 and a first input terminal of the exclusive-OR gate 11 are tied together and connected to the input terminal 1 serving as the input terminal of the edge detecting circuit 9. The output terminal of the non-inverting buffer circuit 10 is connected to a second input terminal of the exclusive-OR gate 11. The edge detecting circuit 9 detects the rising and falling edges of the waveform of a non-inverted input data signal that is supplied to the input terminal 1 and outputs an edge detection signal EMP from the output terminal thereof. The pulse width of the edge detection signal EMP is equal to the delay time of the non-inverting buffer circuit 10, and the delay time can be set appropriately. If the non-inverting buffer circuit 10 is composed by an even-number stages of inverter circuits, then the delay time can be changed by changing the number of stages that operate.

The switch means 13 includes a CMOS-type inverter circuit 14 and a P-channel MOS transistor P1. The source terminal of the P-channel MOS transistor P1 is connected to the high-potential power supply VDD, the drain terminal of the P-channel MOS transistor P1 is connected to one end of the constant-current source 12, and the gate terminal of the P-channel MOS transistor P1 is connected to the output terminal of the inverter circuit 14. The input terminal of the inverter circuit 14 is connected to the output terminal of the exclusive-OR gate 11 serving as the output terminal of the edge detecting circuit 9. The P-channel MOS transistor P1 is turned on when the edge detection signal EMP at the VDD level (the logic H level) is input. The other end of the constant-current source 12 serially connected to the switch means 13 is connected to the drain terminal of the N-channel MOS transistor N1 and to the drain terminal of the N-channel MOS transistor N3.

The source of an N-channel MOS transistor N5 serving as switch means 16 is connected to the low-potential power supply VSS, the drain of the N-channel MOS transistor N5 is connected to one end of the constant-current source 15 and the gate terminal of the N-channel MOS transistor N5 is connected to the output terminal of the exclusive-OR gate 11. The N-channel MOS transistor N5 is turned on when the edge detection signal EMP at the VDD level (the logic H level) is input. The other end of the constant-current source 15 serially connected to the switch means 16 is connected to the source terminal of the N-channel MOS transistor N2 and to the source terminal of the N-channel MOS transistor N4.

Figure 2:
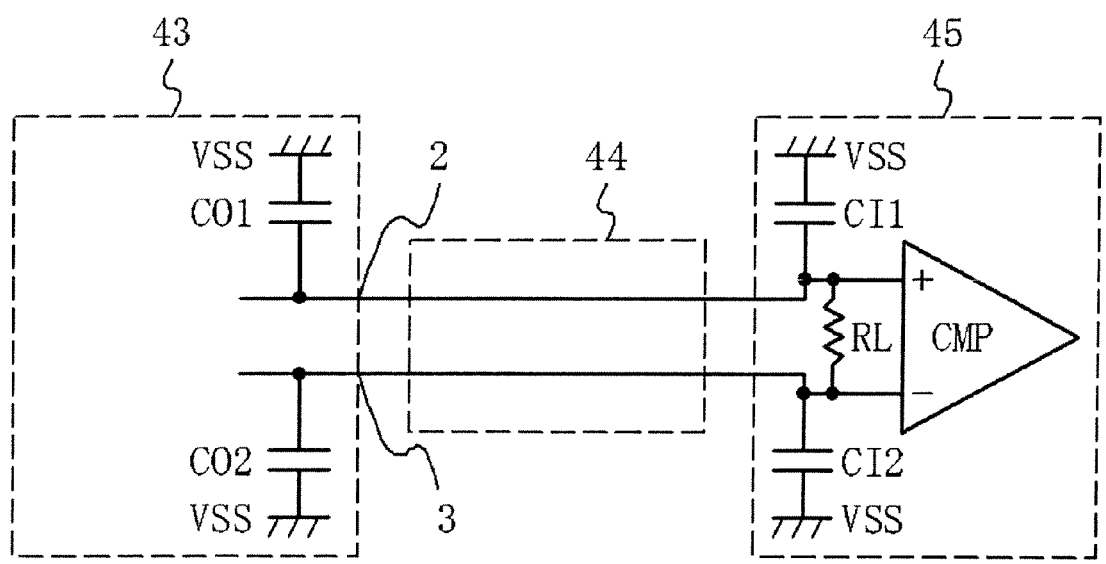
FIG. 2 is a circuit diagram illustrating a transmission circuit having the transmitter circuit of the first embodiment.

FIG. 2 is a circuit diagram illustrating a transmission circuit having the transmitter circuit according to this embodiment. As shown in FIG. 2, the transmission circuit includes a transmitter circuit 43 according to this embodiment, a balanced transmission line 44, which comprises a pair of lines, connected at one end to the non-inverting output terminal 2 and to the inverting output terminal 3 of the transmitter circuit 43, and a receiver circuit 45 connected to the other end of the transmission line 44. The receiver circuit 45 includes a terminating resistor RL connected to the other end of the transmission line 44, and a differential-type voltage comparator CMP having a non-inverted input terminal and an inverting input terminal connected to respective ones of the two ends of the terminating resistor RL. The voltage comparator CMP recognizes signal logic by discriminating the transmission line 44, which comprises aluminum or copper conductor on the glass substrate of a matrix display panel, has a high resistance component. The non-inverting output terminal 2 has a parasitic capacitance CO1 with respect to the low-potential power supply VSS, the inverting output terminal 3 a parasitic capacitance CO2 with respect to the low-potential power supply VSS, the non-inverting terminal of the receiver circuit 45 a parasitic capacitance CI1 with respect to the low-potential power supply VSS, and the inverting terminal of the receiver circuit 45 a parasitic capacitance CI2 with respect to the low-potential power supply VSS.

With regard to the transmitter circuit 43, the CMOS-level non-inverted input data signal that enters the input terminal 1 is applied to the gate terminal of the N-channel MOS transistor N1 and to the gate terminal of the N-channel MOS transistor N4. An inverted input data signal, which is a result of the non-inverted input data signal being inverted by the CMOS-type inverter circuit 5, is applied to the gate terminal of the N-channel MOS transistor N2 and to the gate terminal of the N-channel MOS transistor N3.

The N-channel MOS transistor N1, in response to input of the non-inverted input data signal, switches to pass the current from the high-potential power supply VDD to the non-inverting output terminal 2; the N-channel MOS transistor N3, in response to input of the inverted input data signal, switches to pass the current from the high-potential power supply VDD to the inverting output terminal 3; the N-channel MOS transistor N4, in response to input of the non-inverted input data signal, switches to pass the current from the inverting output terminal 3 to the low-potential power supply VSS; and the N-channel MOS transistor N2, in response to input of the non-inverted input data signal, switches to pass the current from the non-inverting output terminal 2 to the low-potential power supply VSS.

When the non-inverted input data signal is at the VDD level serving as logic H, the N-channel MOS transistors N1 and N4 turn on, the N-channel MOS transistors N2 and N3 turn off, loop signal current flows from the constant-current source 6 to the constant-current source 7 via the N-channel MOS transistor N1, non-inverting output terminal 2, transmission line 44, terminating resistor RL, transmission line 44, inverting output terminal 3 and N-channel MOS transistor N4, and the receiver circuit 45 recognizes the logic H level.

When the non-inverted input data signal is at the VSS level serving as logic L, the N-channel MOS transistors N1 and N4 turn off, the N-channel MOS transistors N2 and N3 turn on, loop signal current in the opposite direction flows from the constant-current source 6 to the constant-current source 7 via the N-channel MOS transistor N3, non-inverting output terminal 3, transmission line 44, terminating resistor RL, transmission line 44, non-inverting output terminal 2 and N-channel MOS transistor N2, and the receiver circuit recognizes the logic L level.

Figure 3:
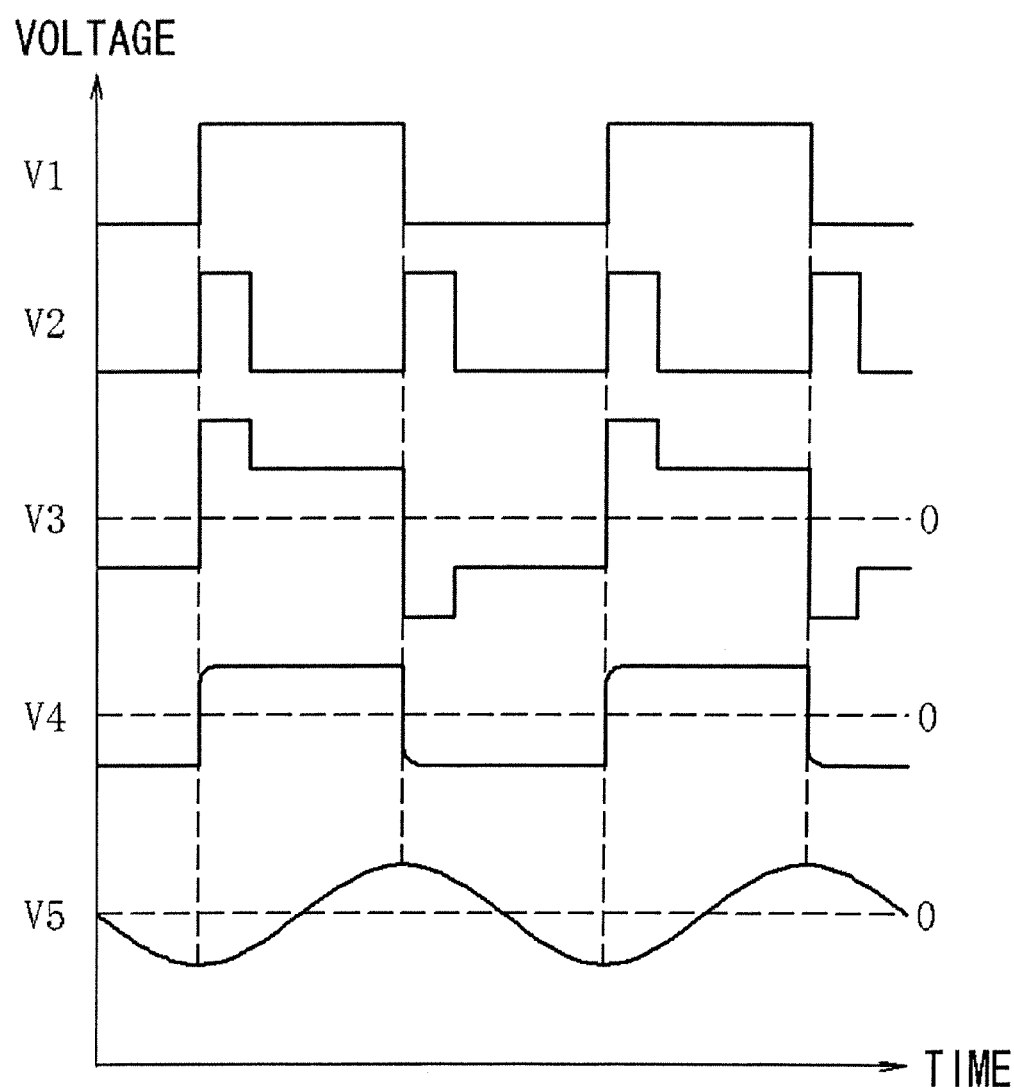
FIG. 3 is a diagram useful in describing the operation of the transmitter circuit of the first embodiment.
Figure 11:
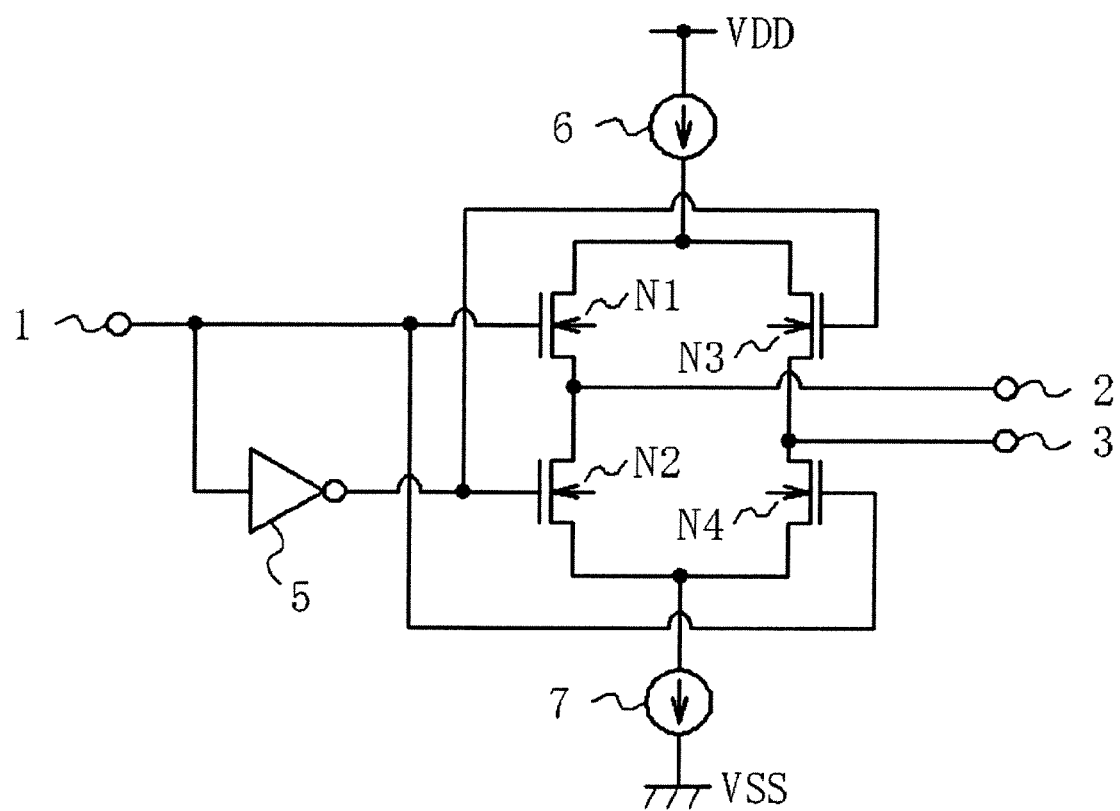
FIG. 11 is a circuit diagram illustrating a transmitter circuit according to the prior art.

Operation according to the first embodiment will be described next. FIG. 3 is a diagram useful in describing the operation of the transmitter circuit according to the first embodiment in the transmission circuit illustrated in FIG. 2. In FIG. 3, a waveform V1 indicates the non-inverted input data signal applied to the input terminal 1, a waveform V2 the edge detection signal EMP that is output from the output terminal of the exclusive-OR gate 11, a waveform V3 the differential output voltage across the non-inverting output terminal 2 and inverting output terminal 3, a waveform V4 the voltage across the terminating resistor RL, and a waveform V5 the voltage across the terminating resistor RL when signal transmission is performed by the prior-art transmitter circuit illustrated in FIG. 11.

First, when the non-inverted input data signal applied to the input terminal 1 does not change, the edge detection signal EMP remains at the VSS level (the logic L level) and the VDD-level (H-level) edge detection signal EMP is not output. When the non-inverted input data signal is at the VDD level (logic H level), therefore, loop signal current flows from the constant-current source 6 to the constant-current source 7 via the N-channel MOS transistor N1, non-inverting output terminal 2, transmission line 44, terminating resistor RL, transmission line 44, inverting output terminal 3 and N-channel MOS transistor N4. When the non-inverted input data signal is at the VSS level (logic L level), oppositely directed loop signal current flows from the constant-current source 6 to the constant-current source 7 via the N-channel MOS transistor N3, inverting output terminal 3, transmission line 44, terminating resistor RL, transmission line 44, non-inverting output terminal 2 and N-channel MOS transistor N2. As a result, the differential output voltage across the non-inverting output terminal 2 and inverting output terminal 3 has a voltage amplitude in the steady state.

Next, if the non-inverted input data signal changes from the VSS level (logic L level) to the VDD level (logic H level), then loop signal current flows from the constant-current source 6 to the constant-current source 7 via the N-channel MOS transistor N1, non-inverting output terminal transmission line 44, terminating resistor RL, transmission line 44, inverting output terminal 3 and N-channel MOS transistor N4. However, the edge detecting circuit 9 detects the rising edge of the waveform of the non-inverted input data signal and outputs the edge detection signal EMP at the VDD level (the logic H level). As a result, the switch means 13 turns on, the current of the constant-current source 12 is added to the current of the constant-current source 6, the switch means 16 also turns on, the current of the constant-current source 15 is added to the current of the constant-current source 7 and the loop signal current increases. When a time equivalent to the pulse width of the edge detection signal EMP elapses from the timing of the rising edge of the waveform of the non-inverted input data signal, the switch means 13 and 16 turn off again and the steady state is attained. Accordingly, the differential output voltage across the non-inverting output terminal 2 and inverting output terminal 3 takes on a signal waveform whose voltage amplitude becomes large temporarily in comparison with the steady state for a period of time equivalent to the pulse width of the edge detection signal EMP measured from the timing of the rising edge of the waveform of the non-inverted input data signal.

Conversely, if the non-inverted input data signal changes from the VDD level (logic H level) to the VSS level (logic L level), then oppositely directed loop signal current flows from the constant-current source 6 to the constant-current source 7 via the N-channel MOS transistor N3, inverting output terminal 3, transmission line 44, terminating resistor RL, transmission line 44, non-inverting output terminal 2 and N-channel MOS transistor N2. However, the edge detecting circuit 9 detects the falling edge of the waveform of the non-inverted input data signal and outputs the edge detection signal EMP at the VDD level (the logic H level). As a result, the switch means 13 turns on, the current of the constant-current source 12 is added to the current of the constant-current source 6, the switch means 16 also turns on, the current of the constant-current source 15 is added to the current of the constant-current source 7 and the loop signal current increases. When a time equivalent to the pulse width of the edge detection signal EMP elapses from the timing of the falling edge of the waveform of the non-inverted input data signal, the switch means 13 and switch means 16 turn off again and the steady state is attained. Accordingly, the differential output voltage across the non-inverting output terminal 2 and inverting output terminal 3 takes on a waveform whose voltage amplitude becomes large temporarily in comparison with the steady state for a period of time equivalent to the pulse width of the edge detection signal EMP measured from the timing of the falling edge of the waveform of the non-inverted input data signal.

The pulse width of the edge detection signal EMP is set in accordance with the relationship among the resistance value of the aluminum or copper conductor, the parasitic capacitors CO1, CO2, CI1 and CI2 and the current values of the constant-current source 12 and constant-current source 15 in such a manner that the voltage across the terminating resistor RL will take on an excellent waveform.

Accordingly, as indicated by waveform V4 in FIG. 3, the voltage across the terminating resistor RL becomes an excellent waveform exhibiting rapid rise and fall that follow up well the non-inverted input data signal. By contrast, the prior-art transmitter circuit illustrated in FIG. 11 does not possess the output-waveform control circuit 8. Consequently, as indicated a V5 in FIG. 3, the waveform becomes rounded or blunted and excellent signal transmission cannot be achieved.

As described above, the transmitter circuit according to the first embodiment of the present invention is provided with the output-waveform control circuit 8 and is adapted so as to increase the output signal amplitude temporarily from the edge of the input data signal waveform. As a result, even if the transmission line has a high resistance component as in the case of aluminum or copper conductor on a glass substrate, blunting of the signal at the input end of the receiver circuit is reduced and it becomes possible to achieve high-speed signal transmission.

Figure 4:
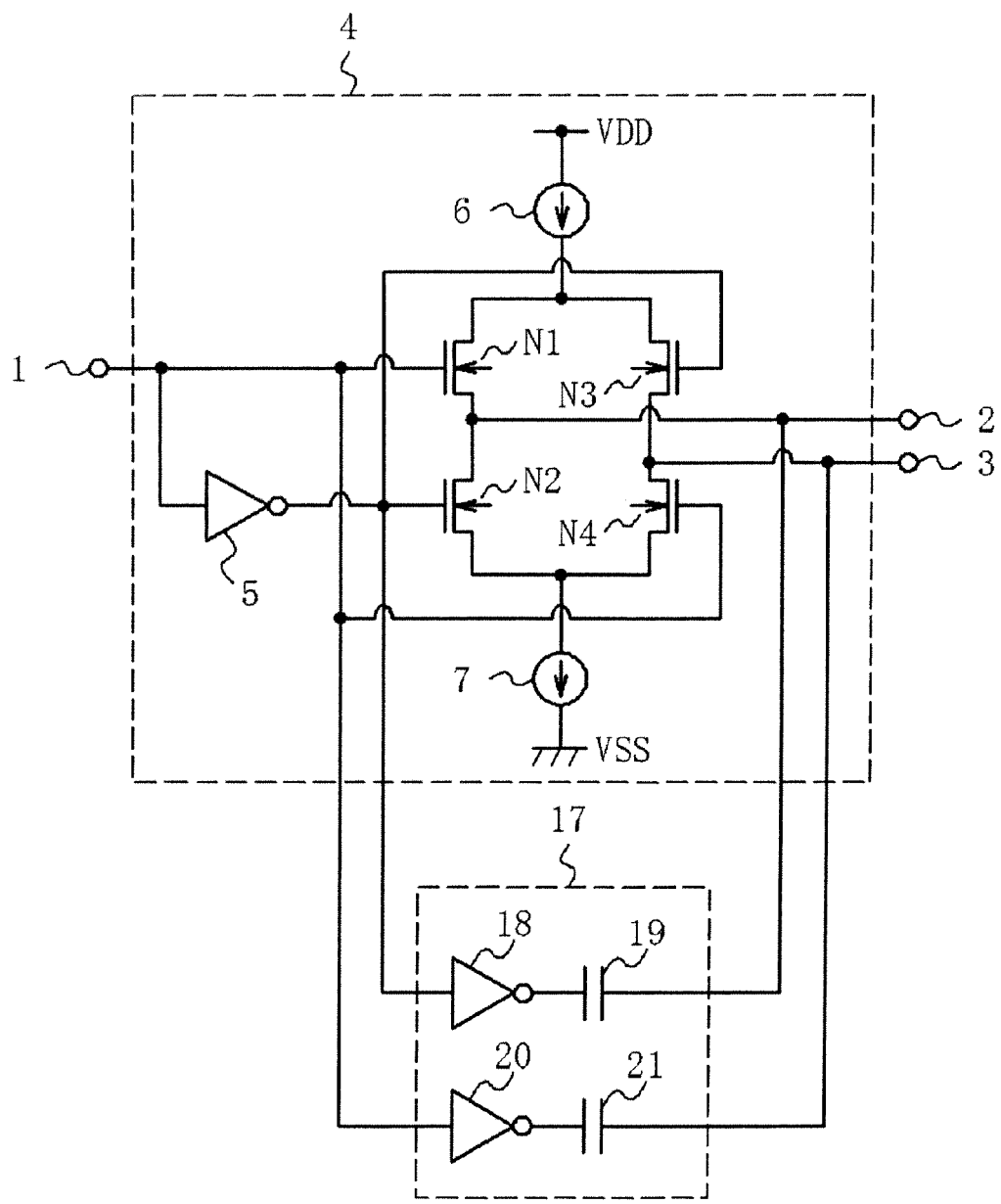
FIG. 4 is a circuit diagram illustrating a transmitter circuit according to a second embodiment of the present invention.

FIG. 4 is a circuit diagram illustrating a transmitter circuit according to a second embodiment of the present invention. Structurally, the transmitter circuit according to the second embodiment of FIG. 4 differs from the transmitter circuit according to the first embodiment of FIG. 1 only in that the output-waveform control circuit 8 is modified to an output-waveform control circuit 17. The two transmitter circuits are structurally identical in all other respects. Components in FIG. 4 identical with those shown in FIG. 1 are designated by like reference characters and need not be described again.

As shown in FIG. 4, the transmitter circuit according to the second embodiment includes the input terminal 1, non-inverting output terminal 2, inverting output terminal 3, driver circuit 4 and output-waveform control circuit 17.

The output-waveform control circuit 17 includes CMOS-type inverter circuits 18 and 20 and capacitors 19 and 21. The input terminal of the inverter circuit 20 is connected to the input terminal 1 and has the non-inverted input data signal applied thereto. One end of the capacitor 21 is connected to the output terminal of the inverter circuit 20 and the other end of the capacitor 21 is connected to the inverting output terminal 3. The input terminal of the inverter circuit 18 is connected to the output terminal of the inverter circuit 5 and has the inverted input data signal applied thereto. One end of the capacitor 19 is connected to the output terminal of the inverter circuit 18 and the other end of the capacitor 19 is connected to the non-inverting output terminal 2.

The capacitor 21 differentiates the output voltage of the inverter circuit 20 and applies the resultant signal to the inverting output terminal 3, and the capacitor 19 differentiates the output voltage of the inverter circuit 18 and applies the resultant signal to the non-inverting output terminal 2.

Figure 5:
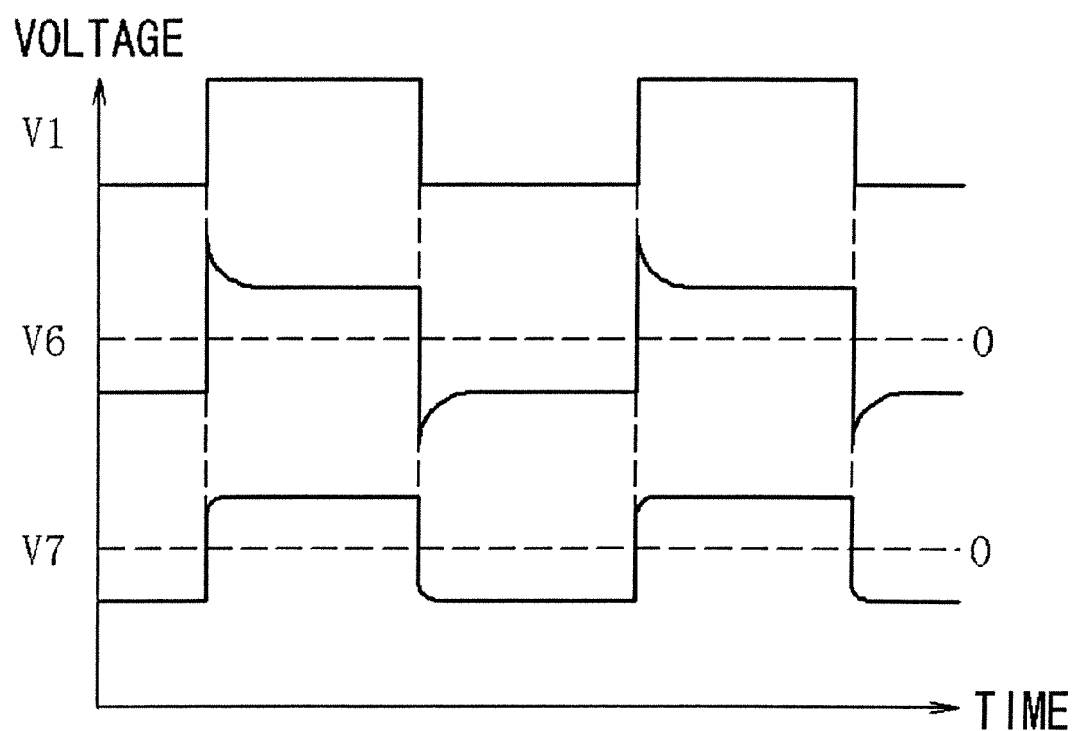
FIG. 5 is a diagram useful in describing the operation of the transmitter circuit of the second embodiment.

Operation according to the second embodiment will be described next. FIG. 5 is a diagram useful in describing the operation of the transmitter circuit according to the second embodiment in the transmission circuit illustrated in FIG. 2. In FIG. 5, the waveform V1 indicates the non-inverted input data signal applied to the input terminal 1, a waveform V6 the differential output voltage across the non-inverting output terminal 2 and inverting output terminal 3, and a waveform V7 the voltage across the terminating resistor RL.

First, when the non-inverted input data signal applied to the input terminal 1 does not change and is at the VDD level (the logic H level), loop signal current flows from the constant-current source 6 to the constant-current source 7 via the N-channel MOS transistor N1, non-inverting output terminal 2, transmission line 44, terminating resistor RL, transmission line 44, inverting output terminal 3 and N-channel MOS transistor N4. When the non-inverted input data signal is at the VSS level (logic L level), oppositely directed loop signal current flows from the constant-current source 6 to the constant-current source 7 via the N-channel MOS transistor N3, inverting output terminal 3, transmission line 44, terminating resistor RL, transmission line 44, non-inverting output terminal 2 and N-channel MOS transistor N2. As a result, the differential output voltage across the non-inverting output terminal 2 and inverting output terminal 3 has a voltage amplitude in the steady state.

Next, if the non-inverted input data signal changes from the VSS level (logic L level) to the VDD level (logic H level), then loop signal current flows from the constant-current source 6 to the constant-current source 7 via the N-channel MOS transistor N1, non-inverting output terminal 2, transmission line 44, terminating resistor RL, transmission line 44, inverting output terminal 3 and N-channel MOS transistor N4. However, the inverter circuit 20 detects the rising edge of the waveform of the non-inverted input data signal and a voltage that is the result of differentiating the output voltage of the inverter circuit 20 by the capacitor 21 is added to the voltage at the inverting output terminal 3. At the same time, the inverter circuit 18 detects the falling edge of the waveform of the inverted input data signal and a voltage that is the result of differentiating the output voltage of the inverter circuit 18 by the capacitor 19 is added to the voltage at the non-inverting output terminal 2, whereby the loop signal current is increased. Accordingly, the differential output voltage across the non-inverting output terminal 2 and inverting output terminal 3 takes on a waveform whose voltage amplitude becomes large temporarily in comparison with the steady state from the timing of the rising edge of the waveform of the non-inverted input data signal.

Conversely, if the non-inverted input data signal changes from the VDD level (logic H level) to the VSS level (logic L level), then oppositely directed loop signal current flows from the constant-current source 6 to the constant-current source 7 via the N-channel MOS transistor N3, inverting output terminal 3, transmission line 44, terminating resistor RL, transmission line 44, non-inverting output terminal 2 and N-channel MOS transistor N2. However, the inverter circuit 20 detects the falling edge of the waveform of the non-inverted input data signal and a voltage that is the result of differentiating the output voltage of the inverter circuit 20 by the capacitor 21 is added to the voltage at the inverting output terminal 3. At the same time, the inverter circuit 18 detects the rising edge of the waveform of the inverted input data signal and a voltage that is the result of differentiating the output voltage of the inverter circuit 18 by the capacitor 19 is added to the voltage at the non-inverting output terminal 2, whereby the loop signal current is increased. Accordingly, the differential output voltage across the non-inverting output terminal 2 and inverting output terminal 3 takes on a waveform whose voltage amplitude becomes large temporarily in comparison with the steady state from the timing of the falling edge of the waveform of the non-inverted input data signal.

The capacitance values of the capacitors 19 and 21 are set in accordance with the relationship among the resistance value of the aluminum or copper conductor and the parasitic capacitors CO1, CO2, CI1 and CI2 (see FIG. 2) in such a manner that the voltage across the terminating resistor RL will take on an excellent waveform.

Accordingly, as indicated by waveform V7 in FIG. 5, the voltage across the terminating resistor RL becomes an excellent waveform exhibiting rapid rise and fall that follow up well the non-inverted input data signal.

In accordance with the transmitter circuit of the second embodiment, as described above, the edge of the waveform of the non-inverted input data signal is detected by the inverter circuit 20 and a voltage that is the result of differentiating the output voltage of the inverter circuit 20 is added to the voltage at the inverting output terminal 3. At the same time, the edge of the non-inverted input data signal is detected by the inverter circuit 18 and a voltage that is the result of differentiating the output voltage of the inverter circuit 18 is added to the voltage at the non-inverting output terminal 2. Accordingly, effects similar to these of the first embodiment are obtained by circuitry of a scale smaller than that of the transmitter circuit of the first embodiment.

Figure 6:
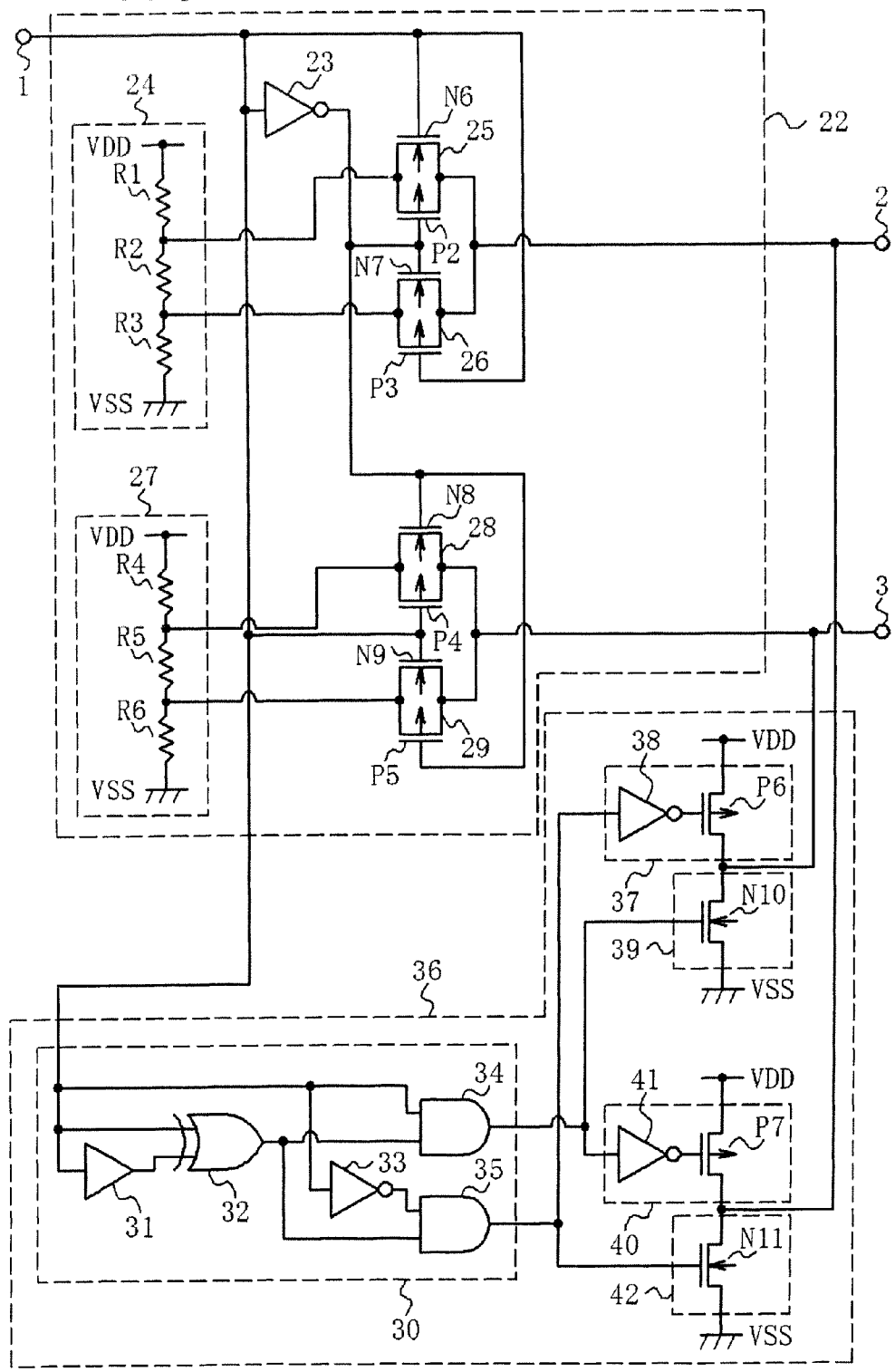
FIG. 6 is a circuit diagram illustrating a transmitter circuit according to a third embodiment of the present invention.

FIG. 6 is a circuit diagram illustrating a transmitter circuit according to a third embodiment of the present invention. As illustrated in FIG. 6, the transmitter circuit according to the third embodiment includes the input terminal 1, the non-inverting output terminal 2, the inverting output terminal 3, a driver circuit 22 and an output-waveform control circuit 36.

The driver circuit 22 includes a CMOS-type inverter circuit 23, potential dividing circuits 24 and 27 and switch means 25, 26, 28 and 29.

The potential dividing circuit 24 has resistors R1, R2 and R3 connected serially between the high-potential power supply VDD and low-potential power supply VSS for generating a potential-divided voltage VH (high level) from the connection node of the resistors R1 and R2 and a potential-divided voltage VL (low level), which is lower than the potential-divided voltage VH, from the connection node of the resistors R2 and R3.

Similarly, the potential dividing circuit 27 has resistors R4, R5 and R6 connected serially between the high-potential power supply VDD and low-potential power supply VSS for generating a potential-divided voltage VH (high level) from the connection node of the resistors R4 and R5 and a potential-divided voltage VL (low level), which is lower than the potential-divided voltage VH, from the connection node of the resistors R5 and R6.

The switch means 25 includes an N-channel MOS transistor N6 and a P-channel MOS transistor P2 and is a transfer gate obtained by connecting the source-drain line of the N-channel MOS transistor N6 in parallel with the source-drain line of the P-channel MOS transistor P2. The potential-divided voltage VH from the potential dividing circuit 24 is applied to one end of the switch means 25; the other end of the switch means 25 is connected to the non-inverting output terminal 2.

The switch means 26 includes an N-channel MOS transistor N7 and a P-channel MOS transistor P3 and is a transfer gate obtained by connecting the source-drain line of the N-channel MOS transistor N7 in parallel with the source-drain line of the P-channel MOS transistor P3. The potential-divided voltage VL from the potential dividing circuit 24 is applied to one end of the switch means 26; the other end of the switch means 26 is connected to the non-inverting output terminal 2.

The input terminal 1 is connected to the gate terminal of the N-channel MOS transistor N6, the gate terminal of the P-channel MOS transistor P3 and the input terminal of the inverter circuit 23. The output terminal of the inverter circuit 23 is connected to the gate terminal of the P-channel MOS transistor P1 and to the gate terminal of the N-channel MOS transistor N7. The switch means 25 and 26 select the potential-divided voltage VH and output it to the non-inverting output terminal 2 when the CMOS-level non-inverted input data signal that enters the input terminal 1 is at the VDD level (the logic H level), and select the potential-divided voltage VL and output it to the non-inverting output terminal 2 when the non-inverted input data is at the VSS level (the logic L level).

The switch means 28 includes an N-channel MOS transistor N8 and a P-channel MOS transistor P4 and is a transfer gate obtained by connecting the source-drain line of the N-channel MOS transistor N8 in parallel with the source-drain line of the P-channel MOS transistor P4. The potential-divided voltage VH from the potential dividing circuit 27 is applied to one end of the switch means 28; the other end of the switch means 28 is connected to the inverting output terminal 3.

The switch means 29 includes an N-channel MOS transistor N9 and a P-channel MOS transistor P5 and is a transfer gate obtained by connecting the source-drain line of the N-channel MOS transistor N8 in parallel with the source-drain line of the P-channel MOS transistor P5. The potential-divided voltage VL from the potential dividing circuit 27 is applied to one end of the switch means 29; the other end of the switch means 28 is connected to the inverting output terminal 3.

The input terminal 1 is connected to the gate terminal of the P-channel MOS transistor P4 and to the gate terminal of the N-channel MOS transistor N9, and the output terminal of the inverter circuit 23 is connected to the gate terminal of the N-channel MOS transistor N8 and to the gate terminal of the P-channel MOS transistor P5. The switch means 28 and 29 select the potential-divided voltage VL and output it to the inverting output terminal 3 when the CMOS-level non-inverted input data signal that enters the input terminal 1 is at the VDD level (the logic H level), and select the potential-divided voltage VH and output it to the inverting output terminal 3 when the non-inverted input data is at the VSS level (the logic L level).

The output-waveform control circuit 36 includes an edge detecting circuit 30 and switch means 37, 39, 40 and 42.

The edge detecting circuit 30 includes a CMOS-type non-inverting buffer circuit 31, a CMOS-type exclusive-OR gate 32, a CMOS-type inverter circuit 33 and CMOS-type AND gates 34 and 35. An input terminal of the non-inverting buffer circuit 31, a first input terminal of the exclusive-OR gate 32, the input terminal of the inverter circuit 33 and a first input terminal of the AND gate 34 are tied together and connected to the input terminal 1 as the input terminal of the edge detecting circuit 30. The output terminal of the non-inverting buffer circuit 31 is connected to a second input terminal of the exclusive-OR gate 32. The output terminal of the exclusive-OR gate 32 is connected to a second input terminal of the AND gate 34 and to a second input terminal of the AND gate 35. The output terminal of the inverter circuit 33 is connected to a first input terminal of the AND gate 35. The edge detecting circuit 30 detects the rising edge of the waveform of the non-inverted input data signal that enters the input terminal 1, thereby outputting the edge detection signal EMP (UP) from the output terminal of the AND gate 34. The edge detecting circuit 30 detects the falling edge of the waveform of the non-inverted input data signal, thereby outputting the edge detection signal EMP (DN) from the output terminal of the AND gate 35. The pulse width of the edge detection signals EMP (UP) and EMP (DN) is equal to the delay time of the non-inverting buffer circuit 31. This delay time can be set appropriately. If the non-inverting buffer circuit 31 is constructed from an even-number of inverter circuit stages, then the delay time can be changed by changing the number of stages that operate.

The switch means 37 includes a CMOS-type inverter circuit 38 and a P-channel MOS transistor P6. The source terminal of the P-channel MOS transistor P6 is connected to the high-potential power supply VDD, the drain terminal of the P-channel MOS transistor P6 is connected to the inverting output terminal 3, the gate terminal of the P-channel MOS transistor P6 is connected to the output terminal of the inverter circuit 38, and the input terminal of the inverter circuit 38 is connected to the output terminal of the AND gate 35. The P-channel MOS transistor P6 is turned on when the edge detection signal EMP (DN) at the VDD level (the logic H level) is input, thereby pulling up the inverting output terminal 3 toward the high-potential power supply VDD.

The switch means 40 includes a CMOS-type inverter circuit 41 and a P-channel MOS transistor P7. The source terminal of the P-channel MOS transistor P7 is connected to the high-potential power supply VDD, the drain terminal of the P-channel MOS transistor P7 is connected to the non-inverting output terminal 2, the gate terminal of the P-channel MOS transistor P7 is connected to the output terminal of the inverter circuit 41, and the input terminal of the inverter circuit 41 is connected to the output terminal of the AND gate 34. The P-channel MOS transistor P7 is turned on when the edge detection signal EMP (UP) at the VDD level (the logic H level) is input, thereby pulling up the non-inverting output terminal 2 toward the high-potential power supply VDD.

The source of an N-channel MOS transistor N10 serving as switch means 39 is connected to the low-potential power supply VSS, the drain of the N-channel MOS transistor N10 is connected to the inverting output terminal 3, and the gate terminal of the N-channel MOS transistor N10 is connected to the output terminal of the AND gate 34. The N-channel MOS transistor N10 is turned on when the edge detection signal EMP (UP) at the VDD level (the logic H level) is input, thereby pulling down the inverting output terminal 3 toward the low-potential power supply VSS.

The source of an N-channel MOS transistor N11 serving as switch means 42 is connected to the low-potential power supply VSS, the drain of the N-channel MOS transistor N11 is connected to the non-inverting output terminal 2, and the gate terminal of the N-channel MOS transistor N11 is connected to the output terminal of the AND gate 35. The N-channel MOS transistor N11 is turned on when the edge detection signal EMP (DN) at the VDD level (the logic H level) is input, thereby pulling down the non-inverting output terminal 2 toward the low-potential power supply VSS.

Figure 7:
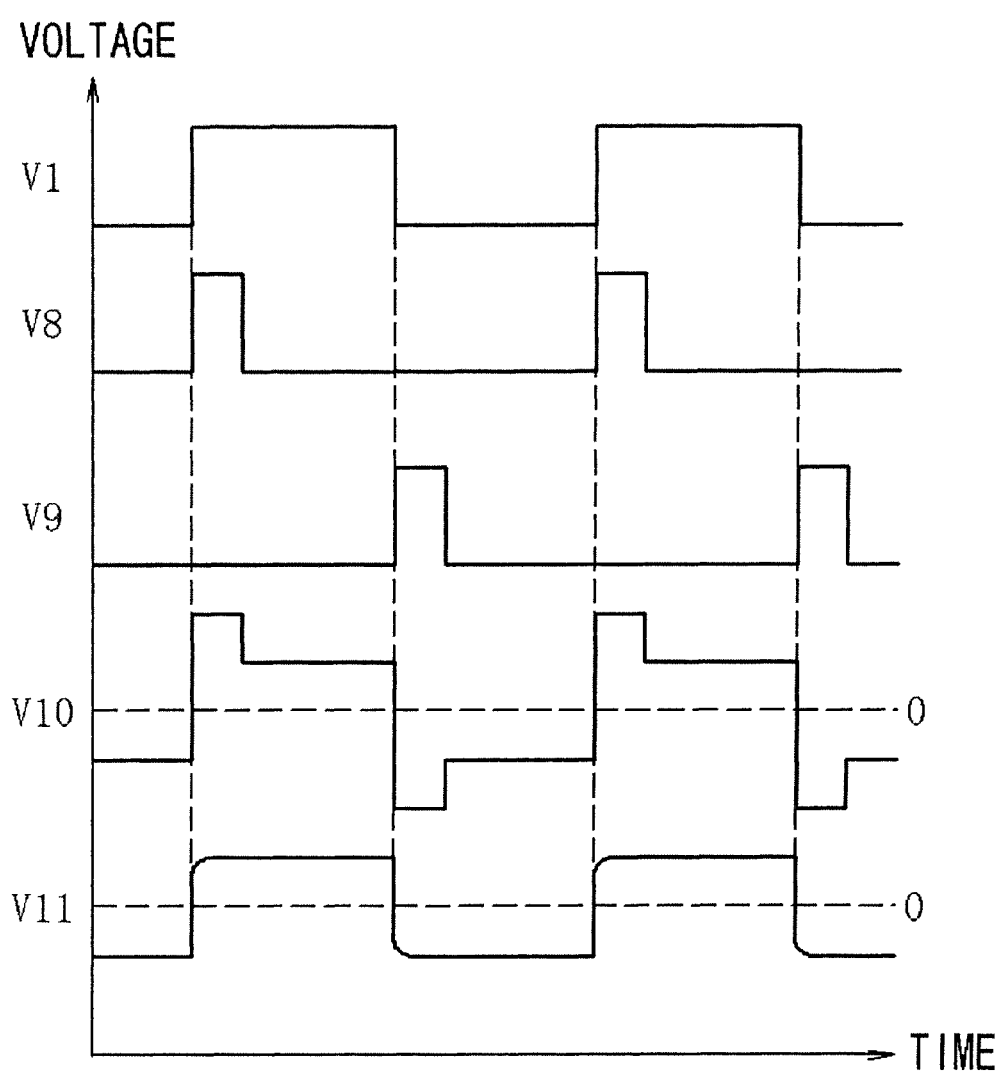
FIG. 7 is a diagram useful in describing the operation of the transmitter circuit of the third embodiment.

Operation according to the third embodiment will be described next. FIG. 7 is a diagram useful in describing the operation of the transmitter circuit according to the third embodiment in the transmission circuit illustrated in FIG. 2. In FIG. 7, waveform V1 indicates the non-inverted input data signal applied to the input terminal 1, a waveform V8 the edge detection signal EMP (UP) that is output from the output terminal of the AND gate 34, a waveform V9 the edge detection signal EMP (DN) that is output from the output terminal of the AND gate 35, a waveform V10 the differential output voltage across the non-inverting output terminal 2 and inverting output terminal 3, and a waveform V11 the voltage across the terminating resistor RL.

First, when the non-inverted input data signal applied to the input terminal 1 does not change, the edge detection signal EMP (UP) and the edge detection signal EMP (DN) remain at the VSS level (the logic L level) and the VDD-level (H-level) edge detection signal EMP (UP) or edge detection signal EMP (DN) is not output. When the non-inverted input data signal is at the VDD level (logic H level), therefore, the potential-divided voltage VH is output to the non-inverting output terminal 2 and the potential-divided voltage VL is output to the inverting output terminal 3. Accordingly, loop signal current flows from the non-inverting output terminal 2 to the inverting output terminal 3 via the transmission line 44, terminating resistor RL and transmission line 44. When the non-inverted input data signal is at the VSS level (logic L level), the potential-divided voltage VH is output to the inverting output terminal 3 and the potential-divided voltage VL is output to the non-inverting output terminal 2. Accordingly, loop signal current flows from the inverting output terminal 3 to the non-inverting output terminal 2 via the transmission line 44, terminating resistor RL and transmission line 44. As a result, the differential output voltage across the non-inverting output terminal 2 and inverting output terminal 3 has a voltage amplitude in the steady state.

Next, if the non-inverted input data signal changes from the VSS level (logic L level) to the VDD level (logic H level), the potential-divided voltage VH is output to the non-inverting output terminal 2 and the potential-divided voltage VL is output to the inverting output terminal 3. Accordingly, loop signal current flows from the non-inverting output terminal 2 to the inverting output terminal 3 via the transmission line 44, terminating resistor RL and transmission line 44. However, the edge detecting circuit 30 detects the rising edge of the waveform of the non-inverted input data signal and outputs the VDD-level (logic H level) edge detection signal EMP (UP). As a result, the switch means 39 turns on and the inverting output terminal 3 is pulled down. Further, the switch means 40 also turns on and the non-inverting output terminal 2 is pulled up. Hence the differential output voltage across the non-inverting output terminal 2 and inverting output terminal 3 increases, thereby increasing the loop signal current. When a time equivalent to the pulse width of the edge detection signal EMP (UP) elapses from the timing of the rising edge of the waveform of the non-inverted input data signal, the switch means 39 and 40 turn off again and the steady state is attained. Accordingly, the differential output voltage across the non-inverting output terminal 2 and inverting output terminal 3 takes on a signal waveform whose voltage amplitude becomes large temporarily in comparison with the steady state for a period of time equivalent to the pulse width of the edge detection signal EMP (UP) measured from the timing of the rising edge of the waveform of the non-inverted input data signal.

Conversely, if the non-inverted input data signal changes from the VDD level (logic H level) to the VSS level (logic L level), then the potential-divided voltage VH is output to the inverting output terminal 3 and the potential-divided voltage VL is output to the non-inverting output terminal 2. Accordingly, loop signal current flows from the inverting output terminal 3 to the non-inverting output terminal 2 via the transmission line 44, terminating resistor RL and transmission line 44. However, the edge detecting circuit 30 detects the falling edge of the waveform of the non-inverted input data signal and outputs the VDD-level (logic H level) edge detection signal EMP (DN). As a result, the switch means 39 turns on and the inverting output terminal 3 is pulled up. Further, the switch means 42 also turns on and the non-inverting output terminal 2 is pulled down. Hence the differential output voltage across the non-inverting output terminal 2 and inverting output terminal 3 increases, thereby increasing the loop signal current. When a time equivalent to the pulse width of the edge detection signal EMP (DN) elapses from the timing of the falling edge of the waveform of the non-inverted input data signal, the switch means 37 and 42 turn off again and the steady state is attained. Accordingly, the differential output voltage across the non-inverting output terminal 2 and inverting output terminal 3 takes on a signal waveform whose voltage amplitude becomes large temporarily in comparison with the steady state for a period of time equivalent to the pulse width of the edge detection signal EMP (DN) measured from the timing of the falling edge of the waveform of the non-inverted input data signal.

The pulse width of the edge detection signals EMP (UP) and EMP (DN) is set in accordance with the relationship among the resistance value of the aluminum or copper conductor, and the parasitic capacitors CO1, CO2, CI1 and CI2 in such a manner that the voltage across the terminating resistor RL will take on an excellent waveform.

Accordingly, as indicated by waveform V11 in FIG. 7, the voltage across the terminating resistor RL becomes an excellent waveform exhibiting rapid rise and fall that follow up well the non-inverted input data signal.

It should be noted that since the transmitter circuit according to this embodiment is of the voltage-output type, signal transmission based upon a differential voltage signal rather than a loop current can be achieved without connecting the terminating resistor RL.

In accordance with the transmitter circuit according to the third embodiment of the invention, as described above, effects similar to those of the transmitter circuit of the first embodiment are obtained. Since the transmitter circuit is of the voltage-output type, signal transmission can be performed without connecting the terminating resistor RL and a further effect obtained is that a limitation on dynamic range can be reduced.

Figure 8:
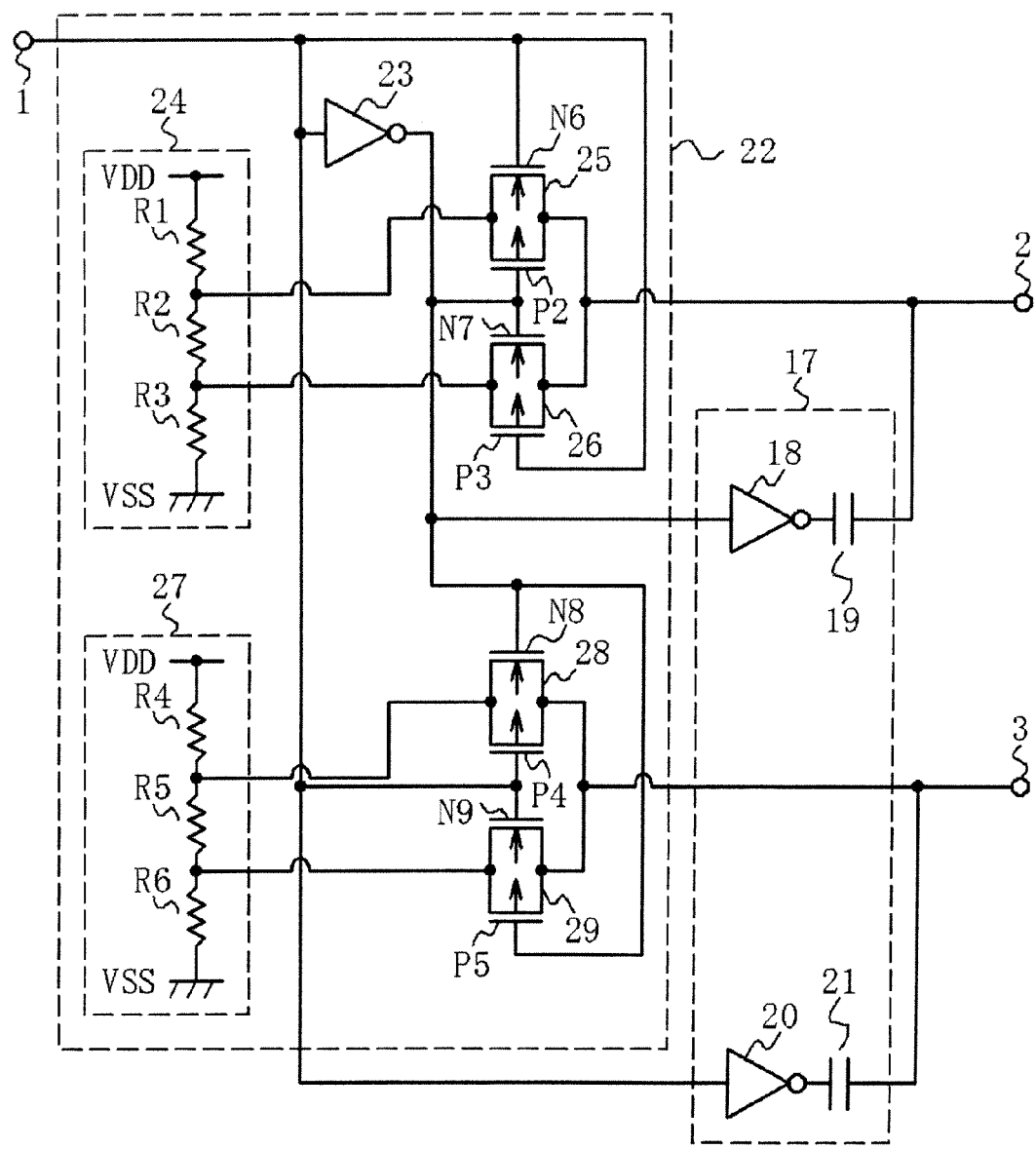
FIG. 8 is a circuit diagram illustrating a transmitter circuit according to a fourth embodiment of the present invention.

FIG. 8 is a circuit diagram illustrating a transmitter circuit according to a fourth embodiment of the present invention. Structurally, the transmitter circuit according to the fourth embodiment of FIG. 8 differs from the transmitter circuit according to the third embodiment of FIG. 6 only in that the output-waveform control circuit 36 in the transmitter circuit of the third embodiment shown in FIG. 6 is replaced with the output-waveform control circuit 17 of the transmitter circuit according to the second embodiment shown in FIG. 4. The two transmitter circuits are structurally identical in all other respects. Components in FIG. 8 identical with those shown in FIGS. 4 and 6 are designated by like reference characters and need not be described again.

As shown in FIG. 8, the transmitter circuit according to the fourth embodiment includes the input terminal 1, non-inverting output terminal 2, inverting output terminal driver circuit 22 and output-waveform control circuit 17.

In accordance with the transmitter circuit of the fourth embodiment, as described above, effects similar to these of the third embodiment are obtained by circuitry of a scale smaller than that of the transmitter circuit of the third embodiment.

Figure 9:
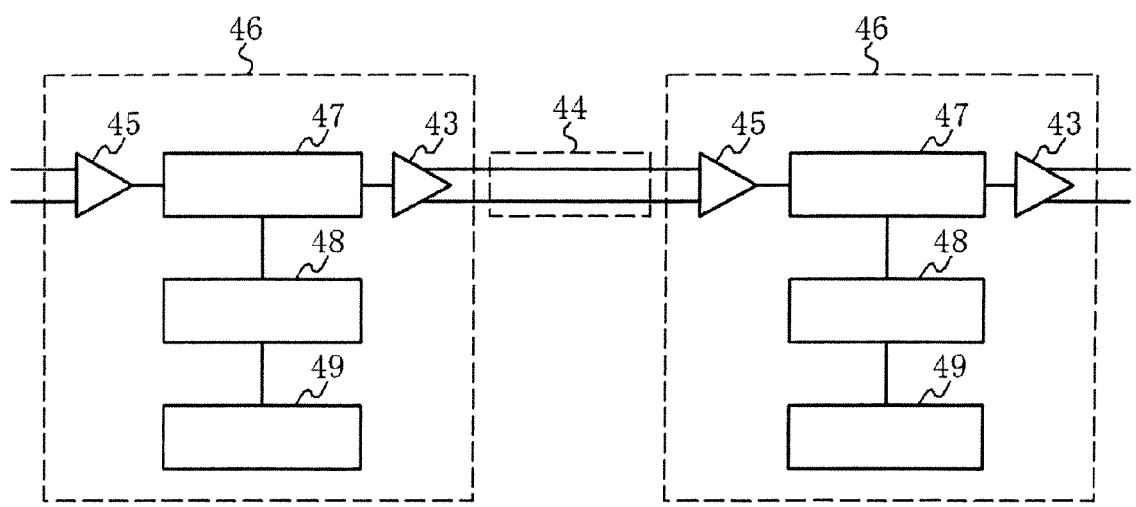
FIG. 9 is a block diagram of driver units according to a fifth embodiment of the present invention.
Figure 10:
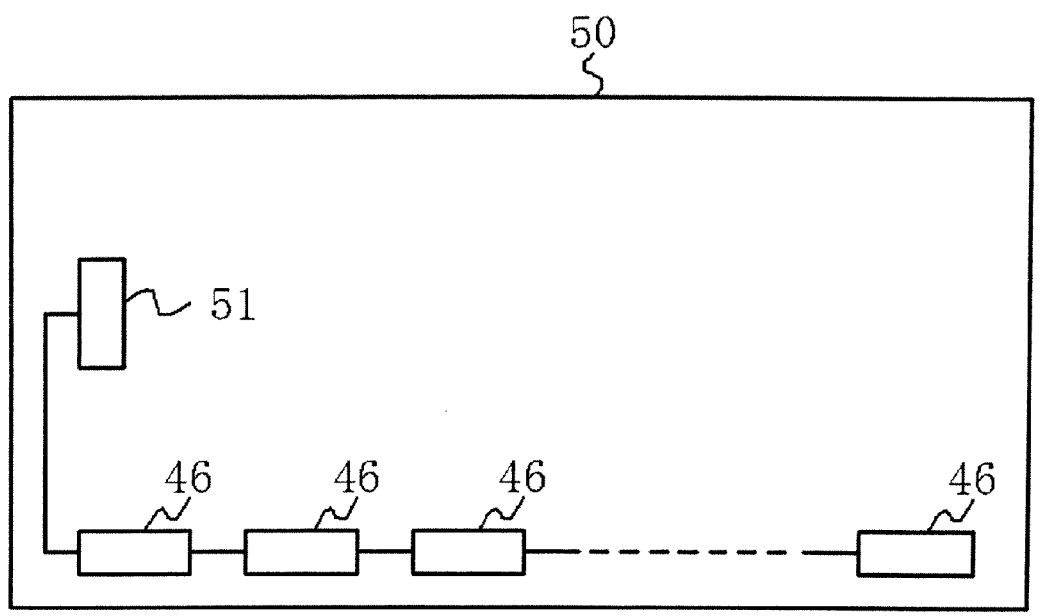
FIG. 10 is a diagram illustrating the structure of a matrix display panel having the driver units of the fifth embodiment.

FIG. 9 is a block diagram of driver units according to a fifth embodiment of the present invention. Specifically, two source driver LSI chips 46 serving as the driver units according to this embodiment are connected in cascade. Further, FIG. 10 is a diagram illustrating the structure of a matrix display panel having driver units according to this embodiment. As illustrated in FIG. 10, a timing controller LSI chip 51 and a plurality of source driver LSI chips 46 are mounted directly on a glass substrate 50 of a matrix display panel of a TFT liquid crystal device, organic EL display device or plasma display device. The timing controller LSI chip 51 and the source driver LSI chips 46 perform transmission of grayscale data signals, and the plurality of source driver LSI chips 46 perform transmission of grayscale data signals in cascade. Transmission is via a transmission line consisting of aluminum or copper conductor formed on the glass substrate 50 by the manufacturing process of the matrix display panel. If the matrix display panel has, e.g., 1024 columns, then eight of the source driver LSI chips 46 each having 128 columns would be connected in cascade.

As shown in FIG. 9, each source driver LSI chip 46 includes the transmitter circuit 43, the receiver circuit 45, a shift register 47, a latch circuit 48 and a data-line driver circuit 49. The transmitter circuit 43 is any one of the transmitter circuit of the first embodiment shown in FIG. 1, the transmitter circuit of the second embodiment shown in FIG. 4, the transmitter circuit of the third embodiment shown in FIG. 6 or the transmitter circuit of the fourth embodiment shown in FIG. 8. Further, the transmitter circuit 43, receiver circuit 45 and the transmission line 44 between the transmitter circuit 43 and the receiver circuit 45 constitute the transmission circuit shown in FIG. 2. The transmission line 44 connected to the input terminal of the receiver circuit 45 from the preceding stage, the output terminal of the receiver circuit 45 is connected to the serial input terminal of the shift register 47, and the serial output terminal of the shift register 47 is connected to the input terminal 1 of the transmitter circuit 43.

When the timing controller LSI chip 51 stores one frame of image data in a frame memory, the timing controller LSI chip 51 successively inputs one horizontal line of grayscale data, which is for driving a data line of the matrix display panel, to cascade-connected shift registers 47 via the transmitter circuit 43, transmission line 44 and receiver circuit 45 while applying a shift clock to each of the source driver LSI chips 46. When 128 columns of grayscale data is stored in the shift register 47, the grayscale data is transferred to the latch circuit 48 in response to a control signal from the timing controller LSI chip 51. Furthermore, analog driving voltage corresponding to the grayscale data held in the latch circuit 48 is sent from the data-line driver circuit 49 to the data line (source line of the TFT) of the matrix display panel, whereby a display is presented.

In accordance with the drive unit of the fifth embodiment, as described above, the drive unit is provided with the transmitter circuit 43 connected to the serial output terminal of one shift register 47, and the receiver circuit 45 connected to the serial input terminal of the other shift register 47. As a result, even though the source driver LSI chips 46 and timing controller LSI chip 51 are mounted on the glass substrate 50 of the matrix display panel and signal transmission is performed by high-resistance aluminum or copper conductor formed on the glass substrate 50, blunting or rounding of the signal waveform at the input terminal of the receiver circuit 45 is reduced, thereby making it possible to perform high-speed transmission of a grayscale data signal.

It should be noted that although the driver circuit in the transmitter circuit according to the first and second embodiments relies upon N-channel MOS transistors, these can be replaced with P-channel MOS transistors.

Further, the non-inverting buffer for delay in the transmitter circuit according to the first and third embodiments may be adapted so as to latch the non-inverted input data signal by a delay clock.

The meritorious effects of the present invention are summarized as follows.

The effect of the present invention is that it is possible to implement a transmitter circuit, transmission circuit and driver unit in which even if a transmission line has a high resistance component, as is the case with aluminum or copper conductor formed on a glass substrate, blunting or rounding of the signal waveform at the input terminal of the receiver circuit is reduced, thereby making it possible to perform high-speed signal transmission.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed:

1. A transmitter circuit, comprising:
   a driver circuit comprising a non-inverting output terminal and an inverting output terminal for outputting a signal current, which has a loop direction that changes based upon an input signal, to the non-inverting output terminal and the inverting output terminal; and
   an output-waveform control circuit for detecting a waveform edge of the input signal and responding by increasing the signal current temporarily,
   wherein said output-waveform control circuit includes:
      a first inverter circuit receiving a non-inverted input signal;
      a first capacitor comprising one end connected to an output terminal of said first inverter circuit and another end connected to the inverting output terminal;
      a second inverter circuit receiving an inverted input signal; and a second capacitor comprising one end connected to an output terminal of the second inverter circuit and another end connected to the non-inverting output terminal.

2. The transmitter circuit according to claim 1, wherein said driver circuit includes:
- a first transistor for receiving a non-inverted input signal and switching in response to pass a current from a high-potential power supply to the non-inverting output terminal;
- a second transistor for receiving an inverted input signal and switching in response to pass a current from the non-inverting output terminal to the low-potential power supply;
- a third transistor for receiving the inverted input signal, and switching in response to pass a current from the high-potential power supply to the inverting output terminal; and
- a fourth transistor for receiving the non-inverted input signal and switching on in response to pass a current from the inverting output terminal to a low-potential power supply.

3. A transmission circuit, comprising:
the transmitter circuit as set forth in claim 1;
a transmission line comprising one end connected to the non-inverting output terminal and the inverting output terminal of said transmitter circuit; and
a receiver circuit connected to the other end of said transmission line.

4. A transmitter circuit, comprising:
a driver circuit, the driving circuit comprising a non-inverting output terminal and an inverting output terminal, for outputting a differential voltage, whose polarity changes based upon an input signal, to the non-inverting output terminal and inverting output terminal; and
an output-waveform control circuit for detecting a waveform edge of the input signal and responding by increasing the differential voltage temporarily,
wherein said output-waveform control circuit includes:
- a first inverter circuit receiving a non-inverted input signal;
- a first capacitor comprising one end connected to an output terminal of said first inverter circuit and another end connected to the inverting output terminal;
- a second inverter circuit receiving an inverted input signal; and
- a second capacitor comprising one end connected to an output terminal of the second inverter circuit and another end connected to the non-inverting output terminal.

5. A transmission circuit, comprising:
the transmitter circuit as set forth in claim 4;
a transmission line comprising one end connected to the non-inverting output terminal and the inverting output terminal of said transmitter circuit; and
a receiver circuit connected to the other end of said transmission line.

6. The matrix display panel according to claim 5, further comprising the transmission line comprising one end connected to the non-inverting output terminal and the inverting output terminal of said transmitter circuit.

7. The matrix display panel according to claim 6, wherein said transmission line comprises a conductor on a glass substrate of the matrix display panel.

8. A matrix display panel, comprising:
a shift register circuit receiving grayscale data for driving data lines of the matrix display panel of the chip-on-glass environment; and
the transmitter circuit as set forth in claim 4, connected to a serial output end of said shift register circuit.

* * * * *